(12) United States Patent
Kim et al.

(10) Patent No.: US 9,865,799 B2
(45) Date of Patent: Jan. 9, 2018

(54) ELECTRONIC DEVICE

(71) Applicant: SK hynix Inc., Icheon-Si (KR)

(72) Inventors: Jeong-Myeong Kim, Icheon-si (KR);
June-Seo Kim, Icheon-si (KR);
Jong-Koo Lim, Icheon-si (KR);
Jung-Hwan Moon, Icheon-si (KR);
Sung-Joon Yoon, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/299,376

(22) Filed: Oct. 20, 2016

(65) Prior Publication Data
US 2017/0194554 A1    Jul. 6, 2017

(30) Foreign Application Priority Data
Dec. 30, 2015  (KR) .................. 10-2015-0189319

(51) Int. Cl.
| | |
|---|---|
| H01L 43/02 | (2006.01) |
| H01L 43/08 | (2006.01) |
| H01L 43/10 | (2006.01) |
| G06F 12/0802 | (2016.01) |
| G06F 13/42 | (2006.01) |
| H01L 27/22 | (2006.01) |
| H01L 43/12 | (2006.01) |

(52) U.S. Cl.
CPC .......... *H01L 43/02* (2013.01); *G06F 12/0802* (2013.01); *G06F 13/4282* (2013.01); *H01L 27/222* (2013.01); *H01L 43/08* (2013.01); *H01L 43/10* (2013.01); *H01L 43/12* (2013.01); *G06F 2212/60* (2013.01)

(58) Field of Classification Search
CPC ......... H01L 43/02; H01L 43/08; H01L 43/10; G11C 11/14–11/16; G11C 11/161
See application file for complete search history.

(56) References Cited

U.S. PATENT DOCUMENTS

| | | | |
|---|---|---|---|
| 6,937,446 B2* | 8/2005 | Kamiguchi | B82Y 10/00 360/324.1 |
| 8,218,355 B2* | 7/2012 | Kitagawa | G11C 11/16 257/421 |
| 2014/0258626 A1* | 9/2014 | Kang | H01L 45/1253 711/125 |
| 2015/0249207 A1* | 9/2015 | Uchida | H01L 43/08 257/421 |

FOREIGN PATENT DOCUMENTS

| | | |
|---|---|---|
| KR | 10-2014-0085376 A | 7/2014 |
| KR | 10-1456393 B1 | 10/2014 |

* cited by examiner

*Primary Examiner* — Allison P Bernstein
(74) *Attorney, Agent, or Firm* — Perkins Coie LLP

(57) ABSTRACT

Provided is an electronic device including a semiconductor memory. The semiconductor memory may include: a pinned layer having a pinned magnetization direction; a free layer having a changeable magnetization direction; a tunnel barrier layer interposed between the pinned layer and the free layer, and including a metal oxide; and a carbon-based compound patch positioned at one or more of between the pinned layer and the tunnel barrier layer, between the free layer and the tunnel barrier layer, and in the tunnel barrier layer.

19 Claims, 7 Drawing Sheets

ELECTRONIC DEVICE

CROSS-REFERENCE TO RELATED APPLICATION

This patent document claims priority of Korean Patent Application No. 10-2015-0189319, entitled "ELECTRONIC DEVICE" and filed on Dec. 30, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory capable of improving the characteristics of a variable resistance element.

In an implementation, there is provided an electronic device including a semiconductor memory. The semiconductor memory may include: a pinned layer having a pinned magnetization direction; a free layer having a changeable magnetization direction; a tunnel barrier layer interposed between the pinned layer and the free layer, and including a metal oxide; and a carbon-based compound patch positioned at one or more of between the pinned layer and the tunnel barrier layer, between the free layer and the tunnel barrier layer, and in the tunnel barrier layer.

Implementations of the above device may include one or more the following.

The tunnel barrier layer has a band gap which is adjusted according to a contact area of the carbon-based compound patch with respect to the tunnel barrier layer. The carbon-based compound patch comprises graphene, graphite oxide or fullerene. The tunnel barrier layer comprises ZnO, and the carbon-based compound patch comprises graphene. A contact area of the carbon-based compound patch with respect to the tunnel barrier layer corresponds to 10% of the area of the tunnel barrier layer. Electron tunneling through the tunnel barrier layer occurs in a region where the carbon-based compound patch exists. When the pinned layer or the free layer has a multilayer structure, a layer of the multilayer structure, which is in contact with the tunnel barrier layer, comprises a ferromagnetic material. The tunnel barrier layer and at least a part of the free layer are in direct contact with each other, and the tunnel barrier layer and at least a part of the pinned layer are in direct contact with each other. The semiconductor memory further comprises a bottom layer to improve the perpendicular magnetic crystalline anisotropy of a layer which is arranged under the MTJ structure and positioned over the bottom layer. The semiconductor memory further comprises a magnetic correction layer to reduce the influence of a stray field generated by the pinned layer.

In an implementation, there is provided an electronic device including a semiconductor memory. The semiconductor memory may include: a first magnetic layer; a second magnetic layer; and a material layer interposed between the first and second magnetic layers, and including a coupling of metal-oxygen-carbon.

Implementations of the above device may include one or more the following.

When a voltage or current applied across the first and second magnetic layers is equal to or more than a predetermined threshold value, electron tunneling occurs through the material layer, and when the voltage or current applied across the first and second magnetic layers is less than the predetermined threshold value, the material layer functions as an insulating material. The content of carbon in the material layer is smaller than the content of metal and oxygen. The carbon of the material layer is positioned at the interface between the first magnetic layer and the material layer or the interface between the second magnetic layer and the material layer.

In an implementation, there is provided an electronic device including a semiconductor memory of a plurality of memory cells, each memory cell including a resistance variable element that includes: a pinned layer having a pinned magnetization direction; a free layer having a changeable magnetization direction; a tunnel barrier layer interposed between the pinned layer and the free layer to allow for electron tunneling between the pinned layer and the free layer; and carbon-based compound patches distributed in contact with the tunnel barrier layer to facilitate the electron tunneling through the tunnel barrier layer.

Implementations of the above device may include one or more the following.

The carbon-based compound patches are distributed so that one or more carbon-based compound patches are at least in part within the tunnel barrier layer. The carbon-based compound patches are distributed so that one or more carbon-based compound patches are completely within the tunnel barrier layer. The carbon-based compound patches are distributed so that one or more carbon-based compound patches are at an interface between the free layer and the tunnel barrier layer or an interface between the pinned layer and the tunnel barrier layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

DETAILED DESCRIPTION

Figure 1A:
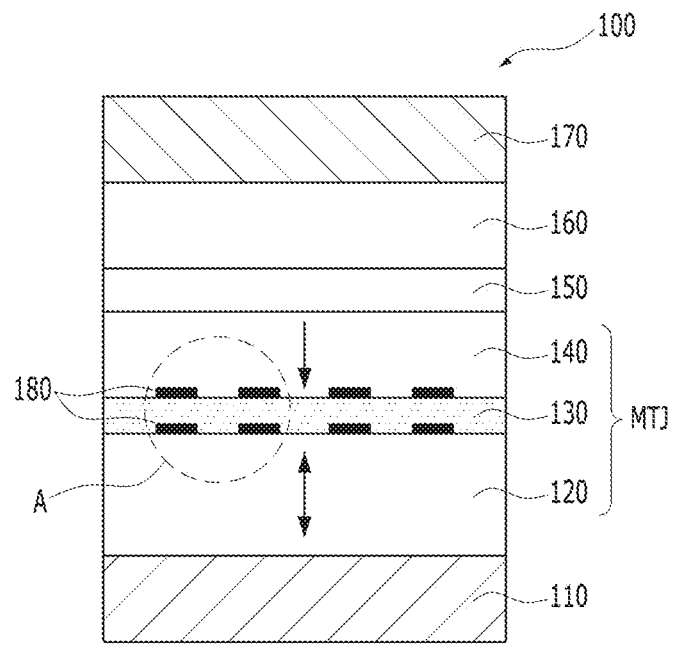
FIG. 1A is a cross-sectional view of a variable resistance element in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A variable resistance element refers to an element which is capable of exhibiting different resistance states and switching between the different resistance states in response to a voltage or current applied across the element. The different resistance states of the variable resistance element can be used to represent different data for data storage. Therefore, such a variable resistance element may be used to function as part of a memory cell for data storage. The memory cell may include, in implementations, a variable resistance element and a selecting element which is coupled to the variable resistance element and controls access to the variable resistance element. Such memory cells may be arranged to form an array in various manners to form a semiconductor memory.

In particular, the variable resistance element in some implementations may include an MTJ (Magnetic Tunnel Junction) structure which includes a free layer having a changeable magnetization direction, a pinned layer having a pinned magnetization direction, and a tunnel barrier layer interposed between the free layer and the pinned layer. According to a voltage or current applied to the variable resistance element, the magnetization direction of the free layer may be changed to be parallel to the magnetization direction of the pinned layer exhibiting a low resistance state, or anti-parallel to the magnetization direction of the pinned layer exhibiting a high resistance state. Thus, the variable resistance element may be in the high or low resistance state and may switch between a low resistance and a high resistance state.

The following implementations provide an enhanced variable resistance element which is capable of satisfying or improving a variety of characteristics which are required by the above-described variable resistance element. More specifically, in the examples described below, carbon-based compound patches are distributed in contact with the tunnel barrier layer of an MTJ to facilitate the electron tunneling through the tunnel barrier layer. In some examples, the carbon-based compound patches can be distributed in a way in which one or more carbon-based compound patches are at least in part within the tunnel barrier layer. In other examples, the carbon-based compound patches are distributed in a way in which one or more carbon-based compound patches are completely within the tunnel barrier layer. In yet other examples, the carbon-based compound patches are distributed so that one or more carbon-based compound patches are at an interface between the free layer and the tunnel barrier layer or an interface between the pinned layer and the tunnel barrier layer.

Figure 1B:
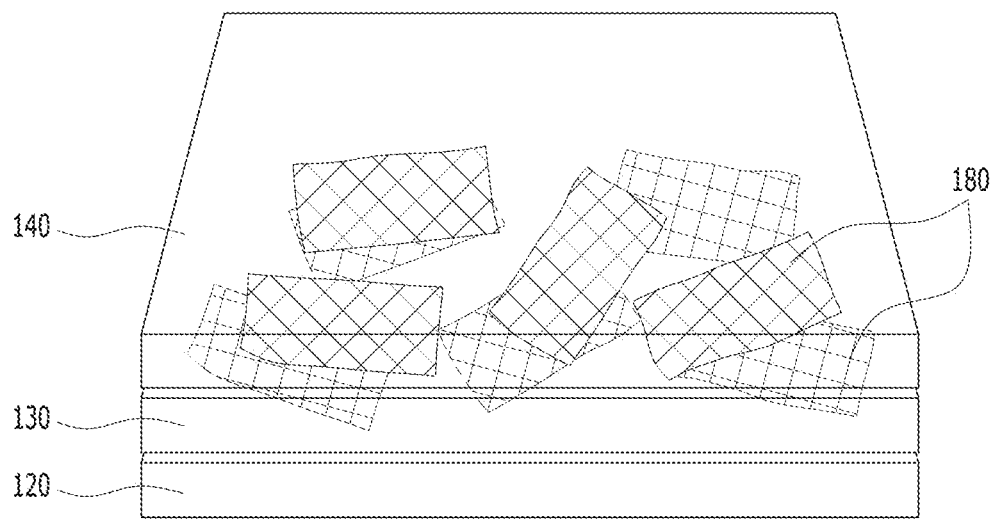
FIG. 1B is an expanded perspective view of a portion A of the variable resistance element of FIG. 1A.

FIG. 1A is a cross-sectional view of a variable resistance element in accordance with an implementation, and FIG. 1B is an expanded perspective view of a portion A of the variable resistance element of FIG. 1A.

Referring to FIGS. 1A and 1B, the variable resistance element 100 in accordance with the implementation may include an MTJ structure which includes a free layer 120 having a changeable magnetization direction, a pinned layer 140 having a pinned magnetization direction, and a tunnel barrier layer 130 interposed between the free layer 120 and the pinned layer 140.

The free layer 120 may have a changeable magnetization direction to store different data based on different magnetization directions. In this context, the free layer 120 may be referred to as a storage layer. The magnetization direction of the free layer 120 may be substantially perpendicular to the surface thereof. In other words, the magnetization direction of the free layer 120 may be substantially parallel to the direction in which the free layer 120, the tunnel barrier layer 130 and the pinned layer 140 are stacked. Thus, the magnetization direction of the free layer 120 may be changed between the direction from bottom to top and the direction from bottom to top (refer to an arrow in the free layer 120). The magnetization direction of the free layer 120 may be changed by a spin transfer torque caused by a current passing through the tunnel barrier layer 130. The free layer 120 may have a single-layer or multilayer structure including a ferromagnetic material. For example, the free layer 120 may include an alloy based on Fe, Ni or Co, for example, Fe—Pt alloy, Fe—Pd alloy, Co—Pd alloy, Co—Pt alloy, Fe—Ni—Pt alloy, Co—Fe—Pt alloy, Co—Fe—B alloy, Co—Ni—Pt alloy, Fe—Pd alloy, Co—Pd alloy, Co—Pt alloy, Fe—Ni—Pt alloy, Co—Fe—Pt alloy or Co—Ni—Pt alloy, or have a stacked structure of Co/Pt or Co/Pt. When the free layer 120 has a multilayer structure including a ferromagnetic material, a layer in contact with the tunnel barrier layer 130, for example, the uppermost layer may be a ferromagnetic material layer. That is, the bottom surface of the tunnel barrier layer 130 may be in contact with the ferromagnetic material layer.

The pinned layer 140 may have a pinned magnetization direction which can be compared to the magnetization direction of the free layer 120. Thus, the pinned layer 140 may be referred to as a reference layer. FIG. 1A illustrates that the pinned layer 140 has a magnetization direction that is perpendicular to the pinned layer 140 for being parallel to or anti-parallel to the magnetization of the free layer 120, e.g., in a direction from top to bottom as shown by an arrow in the pinned layer 140 as one of the two possible directions. The pinned layer 140 may have a magnetization direction from bottom to top. In various implementations, the pinned layer 140 may have a single-layer or multilayer structure including a ferromagnetic material. For example, the pinned layer 140 may include an alloy based on Fe, Ni or Co, for example, Fe—Pt alloy, Fe—Pd alloy, Co—Pd alloy, Co—Pt alloy, Fe—Ni—Pt alloy, Co—Fe—Pt alloy, Co—Fe—B alloy, Co—Ni—Pt alloy, Fe—Pd alloy, Co—Pd alloy, Co—Pt alloy, Fe—Ni—Pt alloy, Co—Fe—Pt alloy or Co—Ni—Pt alloy, or have a stacked structure of Co/Pt or Co/Pt. When the pinned layer 140 has a multilayer structure including a ferromagnetic material, a layer in contact with the tunnel barrier layer 130, for example, the lowermost layer may be a ferromagnetic material layer. That is, the top surface of the tunnel barrier layer 130 may be in contact with the ferromagnetic material layer.

During a write operation in which the resistance state of the variable resistance element 100 is changed, the tunnel barrier layer 130 may change the magnetization direction of the free layer 120 through electron tunneling. During the other operations, the tunnel barrier layer 130 may function as an insulating material. The tunnel barrier layer 130 may include an insulating metal oxide such as MgO, ZnO, CaO, SrO, TiO, VO or NbO.

In the above-described MTJ structure, when a voltage or current equal to or more than a predetermined threshold value for a write operation is applied to the top and bottom of the variable resistance element 100, the magnetization direction of the free layer 120 may be changed by a spin transfer torque. When the magnetization directions of the free layer 120 and the pinned layer 140 are parallel to each other, the variable resistance element 100 may be set in a low resistance state, and store data '1', for example. On the other hand, when the magnetization directions of the free layer 120 and the pinned layer 140 are anti-parallel to each other, the variable resistance element 100 may be set in a high resistance state, and store data '0', for example. Furthermore, the positions of the free layer 120 and the pinned layer 140 may be exchanged to each other. That is, the pinned layer 140 may be positioned under the tunnel barrier layer 13, and the free layer 120 may be positioned over the tunnel barrier layer 13. In this case, the uppermost layer of the pinned layer 140 and the lowermost layer of the free layer 120 may be set to ferromagnetic material layers which are in contact with the tunnel barrier layer 130.

Between the tunnel barrier layer 130 and the free layer 120 and/or between the tunnel barrier layer 130 and the pinned layer 140, a carbon-based compound patch 180 may be interposed. The carbon-based compound patch 180 may be different from the other layers, each of which is formed in a mass, in that the carbon-based compound patch 180 is separated into a plurality of pieces. That is, when the carbon-based compound patch 180 is interposed between the tunnel barrier layer 130 and the free layer 120 and/or between the tunnel barrier layer 130 and the pinned layer 140, the tunnel barrier layer 130 and the free layer 120 and/or the tunnel barrier layer 130 and the pinned layer 140 may be in direct contact with each other through the region where the carbon-based compound patch 180 does not exist. On the other hand, when a carbon-based compound layer is interposed between the tunnel barrier layer 130 and the free layer 120 and/or between the tunnel barrier layer 130 and the pinned layer 140, the tunnel barrier layer 130 may not be in direct contact with the free layer 120 and/or the pinned layer 140. As shown in FIG. 1A, at each location where a carbon-based compound patch 180 is present, between the tunnel barrier layer 130 and the free layer 120 and/or between the tunnel barrier layer 130 and the pinned layer 140, the tunnel barrier layer 130 is separated by the carbon-based compound patch 180 and thus is not in direct contact with the free layer 120 and/or the pinned layer 140.

The carbon-based compound patch 180 may include various carbon-based compounds such as graphene, fullerene or graphite oxide. The size of each carbon-based compound patch 180 may be greater than 0 nm and less than 10 nm. Furthermore, the size of each carbon-based compound patch 180 may be greater than 5 nm and less than 10 nm.

When the carbon-based compound patch 180 is interposed between the tunnel barrier layer 130 and the free layer 120 and/or between the tunnel barrier layer 130 and the pinned layer 140, the following effects may be achieved.

First, the carbon-based compound patch 180 may be in contact with the tunnel barrier layer 130 and adjust the band gap of the tunnel barrier layer 130, such that electron tunneling through the tunnel barrier layer 130 can be easily performed in comparison with the same MTJ structure without such a carbon-based compound patch 180. For this reason, the carbon-based compound patch 180 can reduce a current or voltage which is required during a switching operation of the variable resistance element 100, thereby improving the operation efficiency.

Second, the presence of the carbon-based compound patch 180 may reduce a undesired metal diffusion between the free layer 120 and the pinned layer 140 through the tunnel barrier layer 130 to reduce or prevent the degradation in characteristic of the variable resistance element 100. This diffusion reduction may be explained by, in one aspect, an effective increase in the thickness of the tunnel barrier layer 130 due to the presence of the carbon-based compound patch 180.

Figure 2:
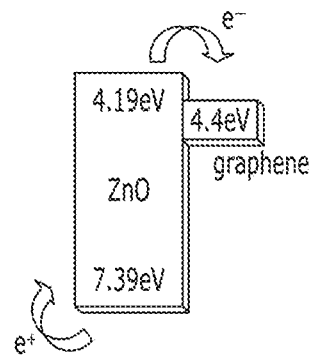
FIG. 2 is a diagram illustrating energy bands when ZnO and graphene are in contact with each other.

It has been experimentally confirmed that the carbon-based compound patch 180 could adjust the band gap of the tunnel barrier layer 130. For example, graphene which is a kind of carbon-based compound may have zero band gap. However, when the graphene is in contact with ZnO which is metal oxide forming the tunnel barrier layer 130, the graphene may have a band gap, and thus reduce the band width of ZnO. This effect is illustrated in FIG. 2. Furthermore, since electron tunneling is easily performed according to the reduction in band width of ZnO, the switching operation efficiency can be improved. This effect is illustrated in FIG. 3.

FIG. 2 is a diagram illustrating energy bands when ZnO and graphene are in contact with each other. In particular, FIG. 2 illustrates energy bands when the area of the graphene, which is in contact with ZnO, corresponds to 10% of the area of ZnO.

Referring to FIG. 2, the band width of ZnO may be reduced by about 0.2 eV through a band gap given to the graphene. For this reason, electron tunneling through ZnO can be more easily performed.

Figure 3:
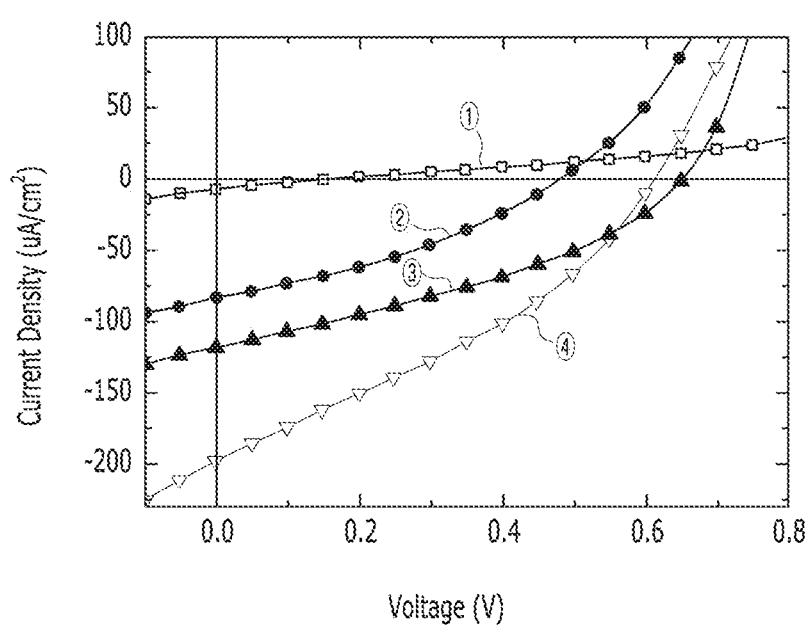
FIG. 3 is a diagram illustrating a current-voltage curve when ZnO and graphene are in contact with each other.

FIG. 3 is a diagram illustrating a current-voltage curve when ZnO and graphene are in contact with each other.

Referring to FIG. 3, current increase rates in case where ZnO and graphene are in contact with each other at various area ratios (refer to ②, ③ and ④) may be higher than a current increase rate in case where only ZnO exists (refer to ①). That is, when ZnO and graphene are in contact with each other, a relatively high current may be passed even though the voltage is increased within a small range. Thus, the switching operation efficiency of the variable resistance element 100 can be expected to increase.

The experiment results of FIGS. 2 and 3 may indicate that the band gap of ZnO can be adjusted when the area of graphene, which is in contact with ZnO, is adjusted with respect to the area of ZnO. Thus, as the contact area of the carbon-based compound patch 180 with respect to the tunnel barrier layer 130 is adjusted in the variable resistance element 100 in accordance with the present implementation, the band gap of the tunnel barrier layer 130 can be adjusted to control the switching operation characteristic of the variable resistance element 100.

Next, strong coupling may be provided between the carbon-based compound patch 180 and the free layer 120 and/or the carbon-based compound patch 180 and the pinned layer 140, and strong coupling may be provided between the carbon-based compound patch 180 and the tunnel barrier layer 130. As a result, the bonding between the tunnel barrier layer 130 and the free layer 120 and/or between the tunnel barrier layer 130 and the pinned layer 140 may be enhanced. This will be described in detail as follows.

For example, when the carbon-based compound patch 180 includes graphene, the π-coupling between the graphene and the 3D valence band of the ferromagnetic material forming the uppermost part of the free layer 120 and/or the lowermost part of the pinned layer 140 may provide strong hybridization between the graphene and the ferromagnetic material. As a result, the bonding between the carbon-based compound patch 180 and the free layer 120 and/or between the carbon-based compound patch 180 and the pinned layer 140 may be enhanced.

For another example, when the carbon-based compound patch 180 includes graphene, the bonding between the carbon-based compound patch 180 and the tunnel barrier layer 130 may be enhanced by coupling between carbon of the graphene and oxygen of the metal oxide of the tunnel barrier layer 130. For another example, when the carbon-based compound patch 180 includes graphite oxide, the bonding between the carbon-based compound patch 180 and the tunnel barrier layer 130 may be enhanced by coupling between oxygen of the graphite oxide and metal ions of the metal oxide of the tunnel barrier layer 130. That is, the carbon-based compound patch 180 and the tunnel barrier layer 130 may include a coupling of metal-oxygen-carbon. At this time, the content of metal and oxygen may be larger than the content of carbon.

Next, since the carbon-based compound patch 180 has relatively low sheet resistance, a current may flow through the region where the carbon-based compound patch 180 exists. In other words, the carbon-based compound patch 180 may serve as a kind of current path and limit the region through which a current is passed. For this reason, the switching operation efficiency of the variable resistance element 100 may be further improved.

In addition, since the carbon-based compound patch 180 has a relatively high thermal conductivity, the carbon-based compound patch 180 may easily radiate Joule's heat generated by electron tunneling during a switching operation of the variable resistance element 100. As a result, the thermal conductivity of the variable resistance element 100 can be improved.

Furthermore, the carbon-based compound patch 180 can reduce an energy loss and physical wear which are caused by the friction or roughness between the tunnel barrier layer 130 and the free layer 120 and/or between the tunnel barrier layer 130 and the pinned layer 140, and reduce lattice mismatch therebetween. As a result, the carbon-based compound patch 180 can solve various problems which are caused by the friction or roughness and the lattice mismatch.

Referring back to FIGS. 1A and 1B, the variable resistance element 100 may further include a plurality of layers for various uses for improving the characteristic of the MTJ structure or the fabrication process, in addition to the MTJ structure. For example, the variable resistance element 100 may further include a bottom layer 110, a spacer layer 150, a magnetic correction layer 160 and a capping layer 170.

The bottom layer 110 may serve to improve the characteristic of the MTJ structure, while being positioned under the MTJ structure. For example, the bottom layer 110 may have various crystalline structures to improve the perpendicular magnetic crystalline anisotropy of a layer arranged over the bottom layer 110, for example, the free layer 120. The bottom layer 110 may have a single-layer structure or multilayer structure including a metal, metal nitride or combination thereof.

The magnetic correction layer 160 may offset or reduce the influence of a stray field generated by the pinned layer 140. In this case, while the influence on the free layer 120 by the stray field of the pinned layer 140 is reduced, a biased magnetic field in the free layer 120 can be reduced. The magnetic correction layer 160 may have a magnetization direction anti-parallel to the magnetization direction of the pinned layer 140. In the present implementation, when the pinned layer 140 has a magnetization direction from top to bottom, the magnetic correction layer 160 may have a magnetization direction from bottom to top. On the other hand, when the pinned layer 140 has a magnetization direction from bottom to top, the magnetic correction layer 160 may have a magnetization direction from top to bottom. The magnetic correction layer 160 may have a single-layer or multilayer structure including a ferromagnetic material.

In the present implementation, the magnetic correction layer 160 may exist over the pinned layer 140, but the position of the magnetic correction layer 160 may be changed in various manners. For example, the magnetic correction layer 160 may be positioned under the MTJ structure. Furthermore, the magnetic correction layer 160 may be patterned separately from the MTJ structure, and arranged at the top, bottom, or side of the MTJ.

The spacer layer 150 may be interposed between the magnetic correction layer 160 and the pinned layer 140, and serve to improve the characteristic of the magnetic correction layer 160 while serving as a buffer between the magnetic correction layer 160 and the pinned layer 140. The spacer layer 150 may include a precious metal such as Ru.

The capping layer 170 may serve as a hard mask when the variable resistance element 100 is patterned, and include various conductive materials such as metal. In particular, the capping layer 170 may be formed of a metal-based material which has a small number of pin holes and has large resistance to wet and/or dry etching. The capping layer 170 may include a precious metal such as Ru.

The above-described variable resistance element 100 may be formed through various methods.

For example, a bottom layer 110 and a free layer 120 may be deposited on a substrate having a predetermined lower structure formed therein.

Then, a carbon-based compound patch 180 may be formed over the free layer 120. The carbon-based compound patch 180 may be formed through a process of spraying a carbon-based compound onto the free layer 120. When the carbon-based compound is sprayed, a gas treatment including various gases, for example, $N_2$, $O_2$ and $H_2$ may be performed at the same time, such that the carbon-based compound stably adheres to the free layer 120. The carbon-based compound patch 180 may be performed through a series of processes of depositing a carbon-based compound on the free layer 120 through PVD (Physical Vapor Deposition) or CVD (Physical Vapor Deposition) and performing a rolling operation.

Then, a tunnel barrier layer 130 may be formed on the free layer 120 having the carbon-based compound patch 180 formed thereon, and another carbon-based compound patch 180 may be formed on the tunnel barrier layer 130.

Then, a pinned layer 140, a spacer layer 150, a magnetic correction layer 160 and a capping layer 170 may be formed over the tunnel barrier layer 130 having the carbon-based compound patch 180 formed thereon, and then selectively etched and patterned in a desired shape.

In the above-described implementation, the carbon-based compound patch 180 may be positioned at the interface between the tunnel barrier layer 130 and the free layer 120 and/or the interface between the tunnel barrier layer 130 and the pinned layer 140, and formed through a separate process from the tunnel barrier layer 130. However, the present implementation is not limited thereto. In another implementation, the carbon-based compound patch 180 may be mixed with the tunnel barrier layer 130, and thus positioned in the tunnel barrier layer 130. This structure will be described in detail with reference to FIG. 4.

Figure 4:
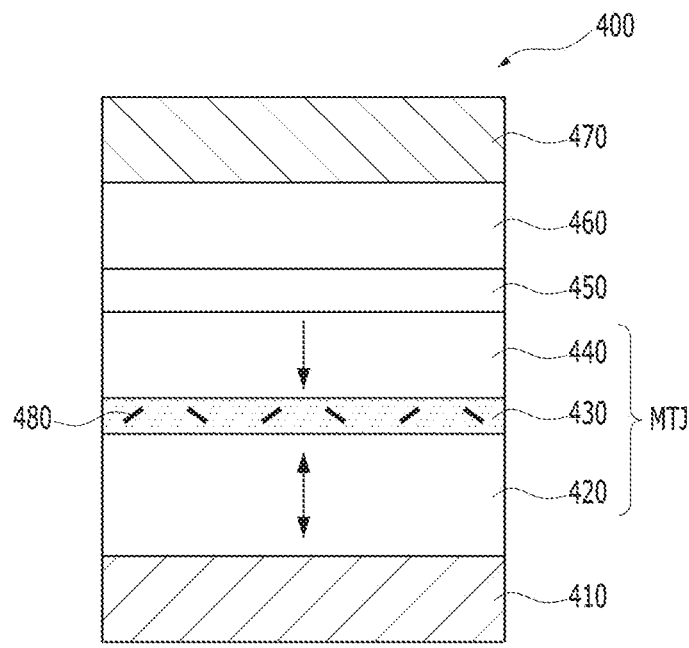
FIG. 4 is a cross-sectional view of a variable resistance element in accordance with another implementation.

FIG. 4 is a cross-sectional view of a variable resistance element in accordance with another implementation. The detailed descriptions of the same components as those of the variable resistance element of FIG. 1A are omitted herein.

Referring to FIG. 4, the variable resistance element 400 in accordance with the present implementation may include an MTJ structure which includes a free layer 420 having a changeable magnetization direction, a pinned layer 440 having a pinned magnetization direction, and a tunnel barrier layer 430 interposed between the free layer 420 and the pinned layer 440. The variable resistance element 400 may further include a bottom layer 410 formed under the MTJ structure and a spacer layer 450, a magnetic correction layer 460 and a capping layer 470, which are sequentially formed over the MTJ structure.

Within the tunnel barrier layer 430, carbon-based compound patches 480 may be randomly distributed or arranged in certain spatial patterns in different configurations. In one example as illustrated in FIG. 4, carbon-based compound patches 480 may be entirely contained within the tunnel barrier layer 430 in a random pattern or some regular spatial pattern. In another example, a part of one or more the carbon-based compound patches 480 may be in contact with the free layer 420 and/or the pinned layer 440, and another part of the carbon-based compound patches 480 may not be in contact with the free layer 420 and/or the pinned layer 440, but surrounded by the tunnel barrier layer 430. In each of the above examples and other configurations for arranging carbon-based compound patches 480, substantially the same effect as the effect of the carbon-based compound patch 180 shown in FIG. 1A may also be achieved to improve the MTJ performance. That is, the band gap of the tunnel barrier layer 430 can be adjusted, the bonding between the tunnel barrier layer 430 and the free layer 420 and/or between the tunnel barrier layer 430 and the pinned layer 440 can be enhanced, the switching operation efficiency of the variable resistance element 400 can be increased with the reduction of sheet resistance, the thermal conductivity of the variable resistance element 400 can be improved with the increase of thermal conductivity, and the interface characteristic between the tunnel barrier layer 430 and the free layer 420 and/or the tunnel barrier layer 430 and the pinned layer 440 can be improved.

The tunnel barrier layer 430 including the carbon-based compound patch 480 may be formed through the following method, for example.

First, a carbon-based compound and metal oxide may be mixed through a predetermined chemical method, and formed on the free layer 120 through a spin coating method. Then, as a thermal treatment is performed at a predetermined temperature, the tunnel barrier layer 430 including the carbon-based compound patch 480 may be formed.

The plurality of variable resistance elements 100 or 400 may be provided to form a semiconductor memory. The semiconductor memory may include various components such as lines and elements for driving both ends of the variable resistance elements 100 or 400. This structure will be described in detail with reference to FIG. 5.

Figure 5:
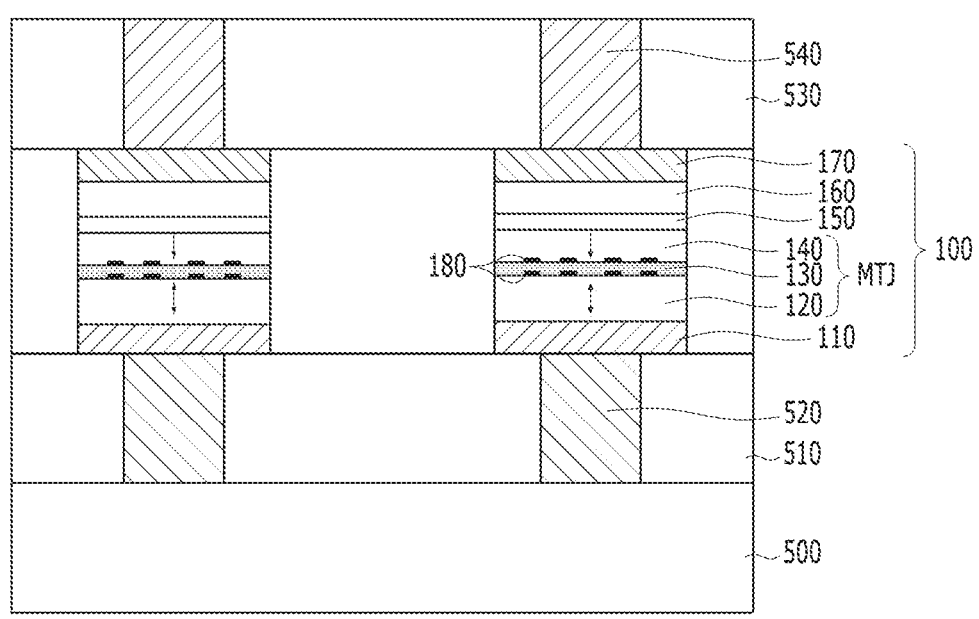
FIG. 5 is a cross-sectional view for describing a memory device and a method for fabricating the same in accordance with an implementation.

FIG. 5 is a cross-sectional view for describing a memory device and a method for fabricating the same in accordance with an implementation.

Referring to FIG. 5, the memory device in accordance with the present implementation may include a substrate 500, a plurality of lower contacts 520, a plurality of variable resistance elements 100, and a plurality of upper contacts 540. The substrate 500 may include transistors for controlling access to a predetermined element (not illustrated), for example, a variable resistance element 100. The plurality of lower contacts 520 may be positioned over the substrate 500 and connect the bottoms of the plurality of variable resistance elements 100 to parts of the substrate 500, for example, the drains of the transistors, respectively. The plurality of variable resistance elements 100 may be positioned over the respective lower contacts 520. The plurality of upper contacts 540 may be positioned over the variable resistance elements 100 and connect the tops of the variable resistance elements 100 to predetermined lines (not illustrated), for example, bit lines, respectively.

The memory device may be formed through the following method.

First, the substrate 500 having transistors formed therein may be prepared, and a first interlayer dielectric layer 510 may be formed over the substrate 500. The first interlayer dielectric layer 510 may be selectively etched to form holes which expose parts of the substrate 500, and a conductive material may be buried in the holes so as to form the lower contacts 520. Then, material layers for forming the variable resistance elements 100 may be formed over the lower contacts 520 and the first interlayer dielectric layer 510, and then selectively etched to form the variable resistance elements 100. The etching process for forming the variable resistance elements 100 may include an IBE method which has a strong physical etching characteristic. Then, a second interlayer dielectric layer 530 may be formed to cover the variable resistance elements 100. The second interlayer dielectric layer 530 may be selectively etched to form holes which expose the tops of the variable resistance elements 100, and a conductive material may be buried in the holes so as to form the upper contacts 540.

In accordance with the implementations, the electronic device including the semiconductor memory can improve the characteristics of the variable resistance element.

The above and other memory circuits or semiconductor devices based on the disclosed technology can be used in a range of devices or systems. FIGS. 6-10 provide some examples of devices or systems that can implement the memory circuits disclosed herein.

Figure 6:
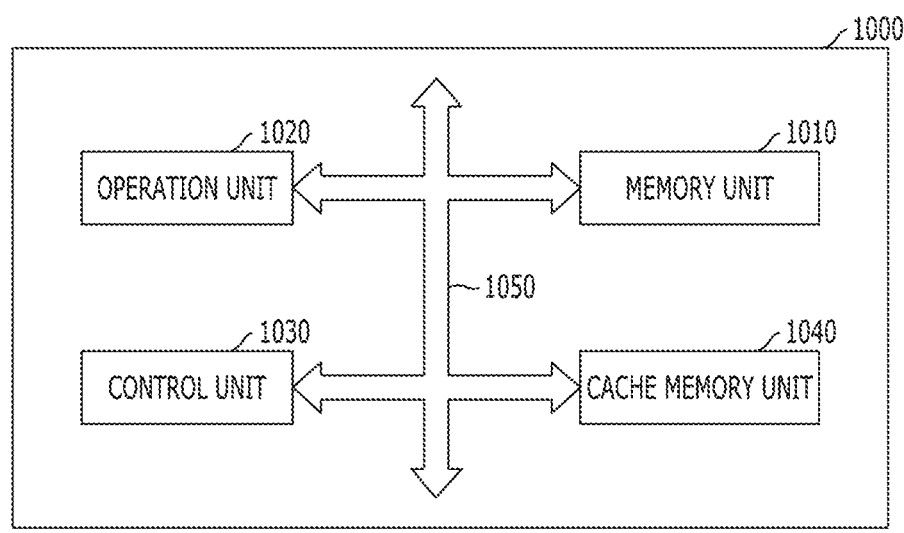
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a pinned layer having a pinned magnetization direction; a free layer having a changeable magnetization direction; a tunnel barrier layer interposed between the pinned layer and the free layer, and including a metal oxide; and a carbon-based compound patch positioned at one or more of between the pinned layer and the tunnel barrier layer, between the free layer and the tunnel barrier layer, and in the tunnel barrier layer. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
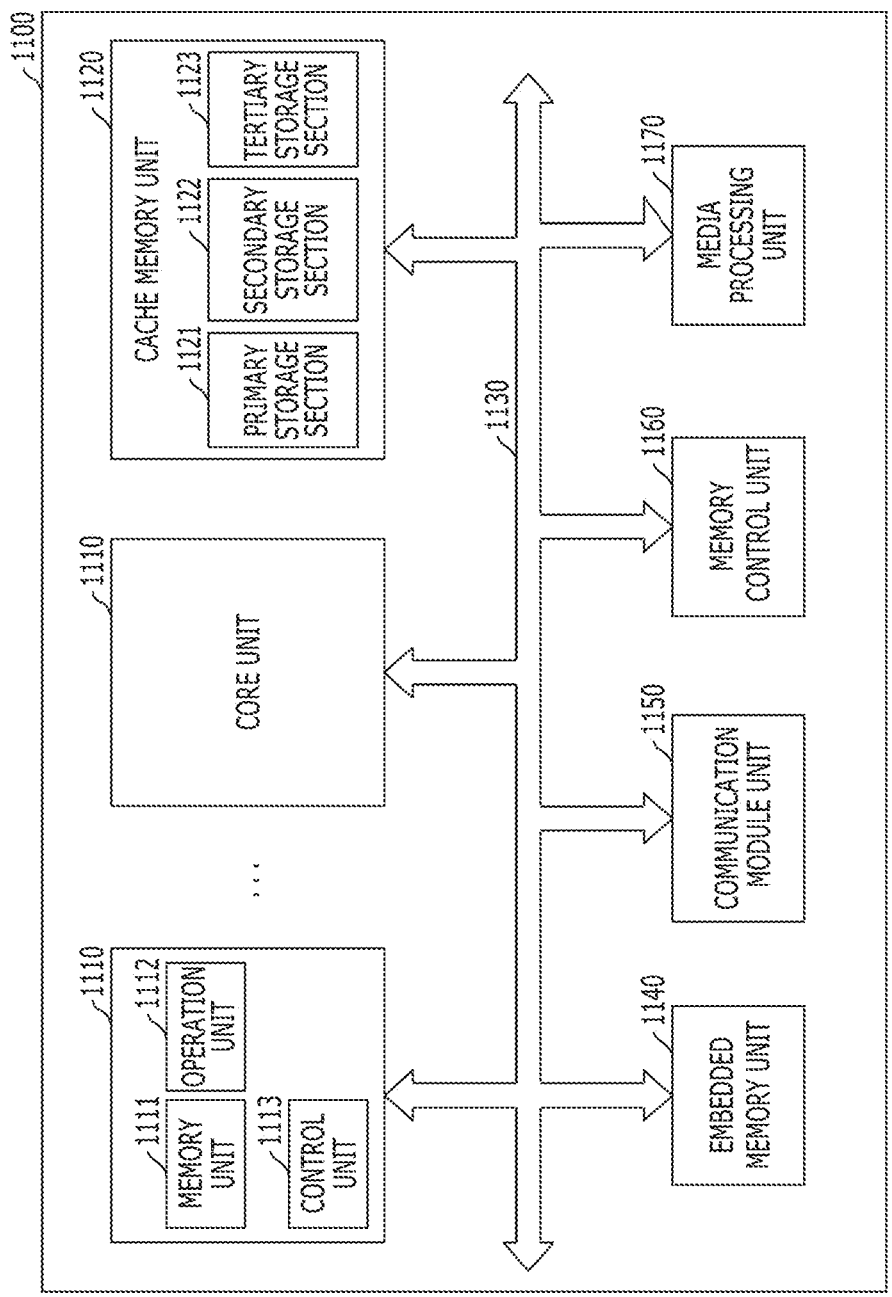
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a pinned layer having a pinned magnetization direction; a free layer having a changeable magnetization direction; a tunnel barrier layer interposed between the pinned layer and the free layer, and including a metal oxide; and a carbon-based compound patch positioned at one or more of between the pinned layer and the tunnel barrier layer, between the free layer and the tunnel barrier layer, and in the tunnel barrier layer. Through this, data storage characteristics of the cache memory unit 1120 may be improved. As a consequence, operating characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
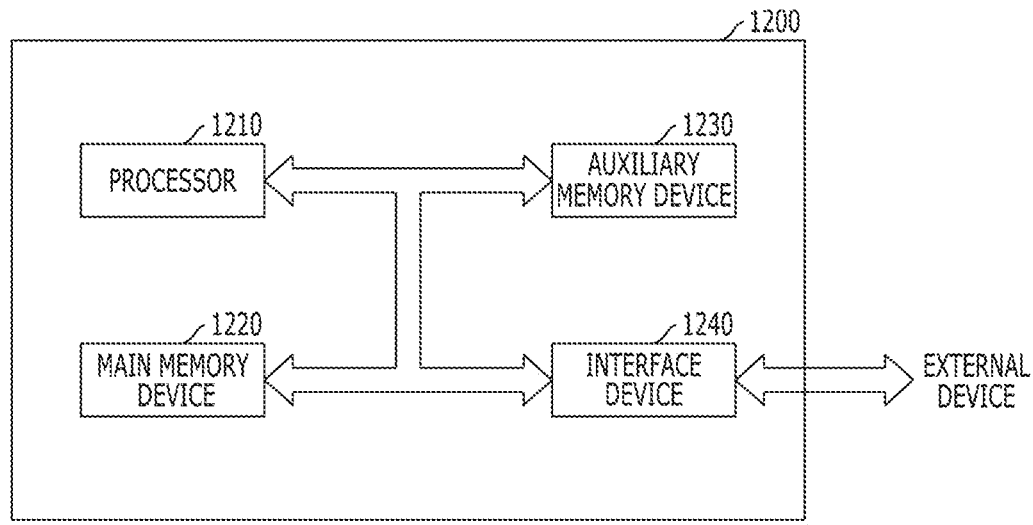
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a pinned layer having a pinned magnetization direction; a free layer having a changeable magnetization direction; a tunnel barrier layer interposed between the pinned layer and the free layer, and including a metal oxide; and a carbon-based compound patch positioned at one or more of between the pinned layer and the tunnel barrier layer, between the free layer and the tunnel barrier layer, and in the tunnel barrier layer. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a pinned layer having a pinned magnetization direction; a free layer having a changeable magnetization direction; a tunnel barrier layer interposed between the pinned layer and the free layer, and including a metal oxide; and a carbon-based compound patch positioned at one or more of between the pinned layer and the tunnel barrier layer, between the free layer and the tunnel barrier layer, and in the tunnel barrier layer. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
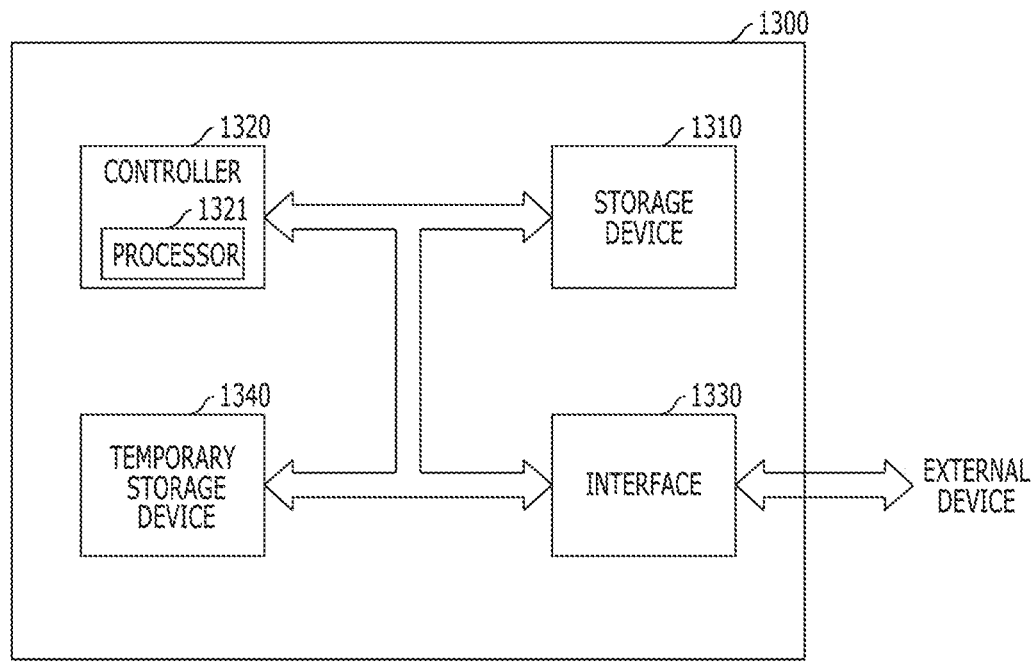
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a pinned layer having a pinned magnetization direction; a free layer having a changeable magnetization direction; a tunnel barrier layer interposed between the pinned layer and the free layer, and including a metal oxide; and a carbon-based compound patch positioned at one or more of between the pinned layer and the tunnel barrier layer, between the free layer and the tunnel barrier layer, and in the tunnel barrier layer. As a consequence, operating characteristics and data storage characteristics of the data storage system 1300 may be improved.

Figure 10:
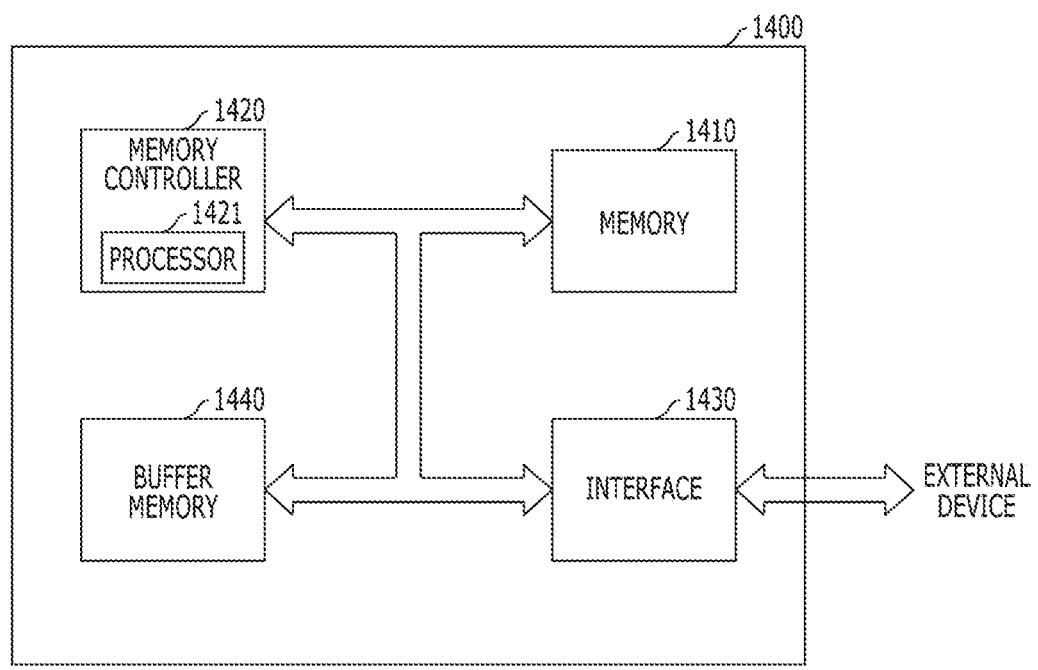
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a pinned layer having a pinned magnetization direction; a free layer having a changeable magnetization direction; a tunnel barrier layer interposed between the pinned layer and the free layer, and including a metal oxide; and a carbon-based compound patch positioned at one or more of between the pinned layer and the tunnel barrier layer, between the free layer and the tunnel barrier layer, and in the tunnel barrier layer. Through this, data storage characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a pinned layer having a pinned magnetization direction; a free layer having a changeable magnetization direction; a tunnel barrier layer interposed between the pinned layer and the free layer, and including a metal oxide; and a carbon-based compound patch positioned at one or more of between the pinned layer and the tunnel barrier layer, between the free layer and the tunnel barrier layer, and in the tunnel barrier layer. Through this, data storage characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
   wherein the semiconductor memory comprises:
   a pinned layer having a pinned magnetization direction;
   a free layer having a changeable magnetization direction;
   a tunnel barrier layer interposed between the pinned layer and the free layer, and including a metal oxide; and
   a carbon-based compound patch positioned between the pinned layer and the tunnel barrier layer, between the free layer and the tunnel barrier layer, or in the tunnel barrier layer, and
   wherein the carbon-based compound patch comprises a graphene, a graphite oxide or a fullerene.

2. The electronic device of claim 1, wherein the tunnel barrier layer has a band gap which is adjusted according to a contact area of the carbon-based compound patch with respect to the tunnel barrier layer.

3. The electronic device of claim 1, wherein electron tunneling through the tunnel barrier layer occurs in a region where the carbon-based compound patch exists.

4. The electronic device of claim 1, wherein when the pinned layer or the free layer has a multilayer structure, a layer of the multilayer structure, which is in contact with the tunnel barrier layer, comprises a ferromagnetic material.

5. The electronic device of claim 1, wherein the tunnel barrier layer and at least a part of the free layer are in direct contact with each other, and
the tunnel barrier layer and at least a part of the pinned layer are in direct contact with each other.

6. The electronic device of claim 1, wherein the semiconductor memory further comprises a bottom layer to improve the perpendicular magnetic crystalline anisotropy of a layer which is arranged under the MTJ structure and positioned over the bottom layer.

7. The electronic device of claim 1, wherein the semiconductor memory further comprises a magnetic correction layer to reduce the influence of a stray field generated by the pinned layer.

8. The electronic device of claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

9. The electronic device of claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

10. An electronic device comprising a semiconductor memory,
wherein the semiconductor memory comprises:
a pinned layer having a pinned magnetization direction;
a free layer having a changeable magnetization direction;
a tunnel barrier layer interposed between the pinned layer and the free layer, and including a metal oxide; and
a carbon-based compound patch positioned between the pinned layer and the tunnel barrier layer, between the free layer and the tunnel barrier layer, or in the tunnel barrier layer, and wherein the tunnel barrier layer comprises ZnO, and the carbon-based compound patch comprises a graphene.

11. The electronic device of claim 10, wherein a contact area of the carbon-based compound patch with respect to the tunnel barrier layer corresponds to 10% of the area of the tunnel barrier layer.

12. An electronic device comprising a semiconductor memory,
wherein the semiconductor memory comprises:
a first magnetic layer;
a second magnetic layer; and
a material layer that is interposed between the first and second magnetic layers, and that includes a graphene, a graphite oxide or a fullerene to effectuate a coupling of metal-oxygen-carbon.

13. The electronic device of claim 12, wherein when a voltage or current applied across the first and second magnetic layers is equal to or more than a predetermined threshold value, electron tunneling occurs through the material layer, and
when the voltage or current applied across the first and second magnetic layers is less than the predetermined threshold value, the material layer functions as an insulating material.

14. The electronic device of claim 12, wherein the content of carbon in the material layer is smaller than the content of metal and oxygen.

15. The electronic device of claim 12, wherein the carbon of the material layer is positioned at the interface between the first magnetic layer and the material layer or the interface between the second magnetic layer and the material layer.

16. An electronic device comprising a semiconductor memory of a plurality of memory cells, each memory cell including a resistance variable element that includes:
a pinned layer having a pinned magnetization direction;
a free layer having a changeable magnetization direction;
a tunnel barrier layer interposed between the pinned layer and the free layer; and
carbon-based compound patches distributed in the tunnel barrier layer, and
wherein the carbon-based compound patch comprises a graphene, a graphite oxide or a fullerene.

17. The device as in claim 16, wherein the carbon-based compound patches are distributed so that one or more carbon-based compound patches are at least in part within the tunnel barrier layer.

18. The device as in claim 16, wherein the carbon-based compound patches are distributed so that one or more carbon-based compound patches are completely within the tunnel barrier layer.

19. The device as in claim 16, wherein the carbon-based compound patches are distributed so that one or more carbon-based compound patches are at an interface between the free layer and the tunnel barrier layer or an interface between the pinned layer and the tunnel barrier layer.

* * * * *